United States Patent
Wang et al.

(10) Patent No.: US 10,770,555 B2
(45) Date of Patent: Sep. 8, 2020

(54) SEMICONDUCTOR DEVICE AND METHOD FOR FORMING THE SAME

(71) Applicant: Vanguard International Semiconductor Corporation, Hsinchu (TW)

(72) Inventors: Chung-Hsuan Wang, Taoyuan (TW); Kan-Sen Chen, Taipei (TW); Sing-Lin Wu, Taichung (TW); Yung-Lung Chou, Hsinchu (TW); Yun-Chou Wei, Taipei (TW); Chia-Hao Lee, New Taipei (TW); Chih-Cherng Liao, Jhudong Township, Hsinchu County (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 4 days.

(21) Appl. No.: 15/658,608

(22) Filed: Jul. 25, 2017

(65) Prior Publication Data
US 2019/0035900 A1 Jan. 31, 2019

(51) Int. Cl.
*H01L 29/66* (2006.01)
*H01L 29/40* (2006.01)
(Continued)

(52) U.S. Cl.
CPC ...... *H01L 29/408* (2013.01); *H01L 21/31155* (2013.01); *H01L 29/1045* (2013.01);
(Continued)

(58) Field of Classification Search
CPC .......... H01L 29/66492; H01L 29/7833; H01L 29/66537; H01L 29/66545; H01L 29/7845; H01L 29/41791; H01L 21/0337; H01L 21/3086; H01L 23/5283; H01L 23/53266; H01L 27/1104; H01L 28/24;
(Continued)

(56) References Cited

U.S. PATENT DOCUMENTS 6,093,951 A * 7/2000 Burr .................... H01L 29/1045
257/286
6,566,205 B1 * 5/2003 Yu ...................... H01L 21/28202
438/287

(Continued)

*Primary Examiner* — Moin M Rahman
(74) *Attorney, Agent, or Firm* — Birch, Stewart, Kolasch & Birch, LLP (57) ABSTRACT

The present disclosure relates to a semiconductor device. The semiconductor device includes a gate structure disposed on a semiconductor substrate, a sidewall spacer disposed on sidewalls of the gate structure, a lightly-doped source/drain region formed in the semiconductor substrate on opposite sides of the gate structure, a source/drain region formed in the semiconductor substrate on opposite sides of the sidewall spacer, a halo implant region formed in the semiconductor substrate below the gate structure and adjacent to the lightly-doped source/drain region, and a counter-doping region formed in the semiconductor substrate below the gate structure and between the lightly-doped source/drain region and the halo implant region. The dopant concentration of the counter-doping region is lower than the dopant concentration of the halo implant region.

20 Claims, 5 Drawing Sheets

(51) Int. Cl.
*H01L 29/10* (2006.01)
*H01L 29/78* (2006.01)
*H01L 21/3115* (2006.01)
*H01L 29/51* (2006.01)

(52) U.S. Cl.
CPC ........ *H01L 29/1083* (2013.01); *H01L 29/518* (2013.01); *H01L 29/6659* (2013.01); *H01L 29/66492* (2013.01); *H01L 29/66537* (2013.01); *H01L 29/7833* (2013.01)

(58) Field of Classification Search
CPC ............. H01L 29/6653; H01L 29/7854; H01L 23/5329; H01L 28/20; H01L 29/41783; H01L 21/02532; H01L 21/02636; H01L 23/528; H01L 29/66636; H01L 29/7851; H01L 29/66795; H01L 29/7846; H01L 23/5226; H01L 23/53209; H01L 23/53238; H01L 29/66818; H01L 29/7848; H01L 29/7843; H01L 29/6656; H01L 21/02164; H01L 21/0217; H01L 21/8238–823892; H01L 27/092–0928; H01L 21/823493; H01L 29/66522; H01L 29/04–2206

See application file for complete search history.

(56) References Cited

U.S. PATENT DOCUMENTS

| | | | |
|---|---|---|---|
| 2005/0127445 A1* | 6/2005 | Ker | H01L 27/0251 257/355 |
| 2006/0141724 A1* | 6/2006 | Kim | H01L 21/26506 438/301 |
| 2008/0073719 A1* | 3/2008 | Fazan | G11C 11/403 257/347 |
| 2013/0001665 A1* | 1/2013 | Zhu | H01L 21/2652 257/314 |
| 2014/0291759 A1* | 10/2014 | Zhao | H01L 29/66598 257/336 |
| 2015/0041910 A1* | 2/2015 | Flachowksy | H01L 21/823807 257/369 |
| 2015/0084108 A1* | 3/2015 | Saha | H01L 21/823807 257/314 |
| 2015/0255514 A1* | 9/2015 | Nakai | H01L 27/2436 257/4 |
| 2018/0025948 A1* | 1/2018 | Cho | H01L 27/0928 438/217 |

* cited by examiner

SEMICONDUCTOR DEVICE AND METHOD FOR FORMING THE SAME

BACKGROUND

The present disclosure relates to a semiconductor device, and in particular it relates to a semiconductor device that includes a halo implant region, and to a method for forming the same.

Semiconductor devices are used in a variety of electronic applications, such as personal computers, cell phones, digital cameras, and other electronic devices. These semiconductor devices are typically fabricated by depositing an insulating layer or dielectric layer, a conductive layer material, and a semiconductor layer material on the semiconductor substrate in sequence, followed by patterning the various material layers by using a photolithography process. Therefore, the circuit devices and components are formed on the semiconductor substrate.

In the course of the evolution of semiconductor devices, their geometric dimensions have been steadily decreasing, which poses challenges for the manufacturers of semiconductors (these challenges include the reverse short channel effect, and leakage current leaking from between the source region and the drain region). If the leakage current is too large, the life span of the devices will decrease. Generally, leakage current can be reduced by increasing the dopant concentration of the well region. However, it will result in an increase of the threshold voltage of the semiconductor device, thus being disadvantageous to operation. In addition, if the reverse short channel effect is too severe, it will increase the difference between the threshold voltage of a short channel device and a long channel device, thus increasing the difficulty of designing the device.

Therefore, although existing semiconductor devices and the manufacturing thereof generally meet the requirements with respect to their intended use, some improvements are necessary.

SUMMARY

In some embodiments, the present disclosure relates to a semiconductor device. The semiconductor device includes a semiconductor substrate; a gate structure disposed on the semiconductor substrate; a sidewall spacer disposed on sidewalls of the gate structure; a lightly doped source/drain region formed in the semiconductor substrate on opposite sides of the gate structure; a source/drain region formed in the semiconductor substrate on opposite sides of the sidewall spacer; a halo implant region formed in the semiconductor substrate below the gate structure and adjacent to the lightly doped source/drain region; and a counter-doping region formed in the semiconductor substrate below the gate structure and between the lightly doped source/drain region and the halo implant region. A dopant concentration of the counter-doping region is lower than a dopant concentration of the halo implant region.

In other embodiments, the present disclosure relates to a method for manufacturing a semiconductor device. The method includes providing a semiconductor substrate; forming a gate structure on the semiconductor substrate; forming a halo implant region in the semiconductor substrate around and below the gate structure; forming a lightly doped source/drain region in the semiconductor substrate on opposite sides of the gate structure, wherein the halo implant region is adjacent to the lightly doped source/drain region; forming a sidewall spacer on sidewalls of the gate structure; forming a source/drain region in the semiconductor substrate on opposite sides of the sidewall spacer; and forming a counter-doping region in the semiconductor substrate below the gate structure and between the lightly doped source/drain region and the halo implant region. A dopant concentration of the counter-doping region is lower than a dopant concentration of the halo implant region.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed. It should be understood that additional steps can be implemented before, during, or after the illustrated methods, and some steps might be replaced or omitted in other embodiments of the illustrated methods.

The method for forming a semiconductor device of the present disclosure can reduce the reverse short channel effect by forming a counter-doping region with a dopant concentration lower than the halo implant region in a semiconductor substrate under a gate structure. In addition, as noted above, a dopant concentration of the well region should be enough to reduce the leakage current between the source region and the drain region (or to increase the ratio of $I_{on}$ to $I_{off}$), and the positive charges formed in the lower portion of the gate dielectric layer of the semiconductor device in the present disclosure can avoid or reduce the increase of the threshold voltage of the semiconductor device resulting from increasing the dopant concentration of the well region. An N-type metal-oxide-semiconductor (NMOS) will be used as an example to describe the present disclosure in the following. However, it should be understood that a person with ordinary skill in the art can apply the illustrated method of the present disclosure to a P-type metal-oxide-semiconductor (PMOS), a complementary metal-oxide-semiconductor (CMOS), a high voltage transistor, a laterally diffused metal-oxide-semiconductor (LDMOS), and other applicable semiconductor devices.

Figure 1:
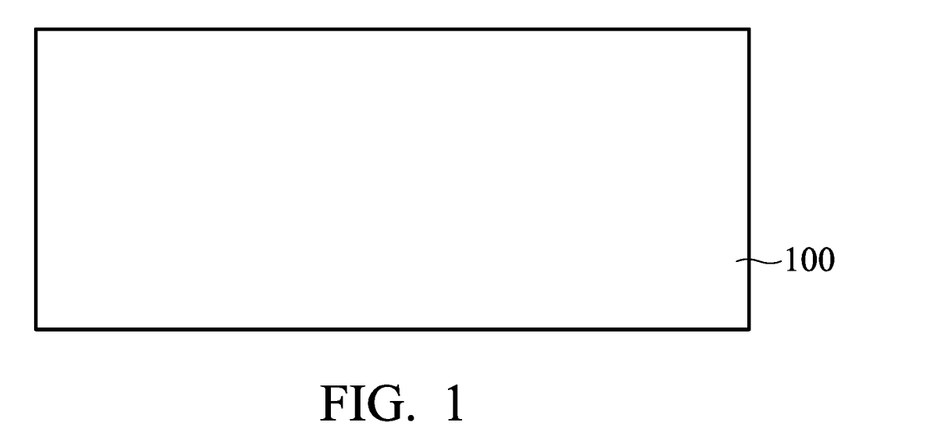
FIGS. 1-6, 7A, 7B, and 8 are a series of cross-sectional views illustrating a process for manufacturing a semiconductor device according to embodiments of the present disclosure.

FIG. 1 illustrates an initial step according to an embodiment of the present disclosure. Firstly, a semiconductor substrate 100 is provided. For example, the semiconductor substrate 100 may include silicon. In some other embodiments, the semiconductor substrate 100 may include other elementary semiconductor materials (e.g., germanium), compound semiconductor materials (e.g., silicon carbide (SiC), gallium arsenic (GaAs), indium arsenide (InAs), or indium phosphide (InP)), and alloy semiconductor materials (e.g., silicon germanium (SiGe), silicon germanium carbide (SiGeC), gallium arsenic phosphide (GaAsP), or gallium indium phosphide (GaInP)). The semiconductor substrate 100 may also include a semiconductor-on-insulator (SOI) substrate. The SOI substrate may include a bottom substrate, a buried oxide layer disposed on the bottom substrate, and a semiconductor layer disposed on the buried oxide layer.

Figure 2:
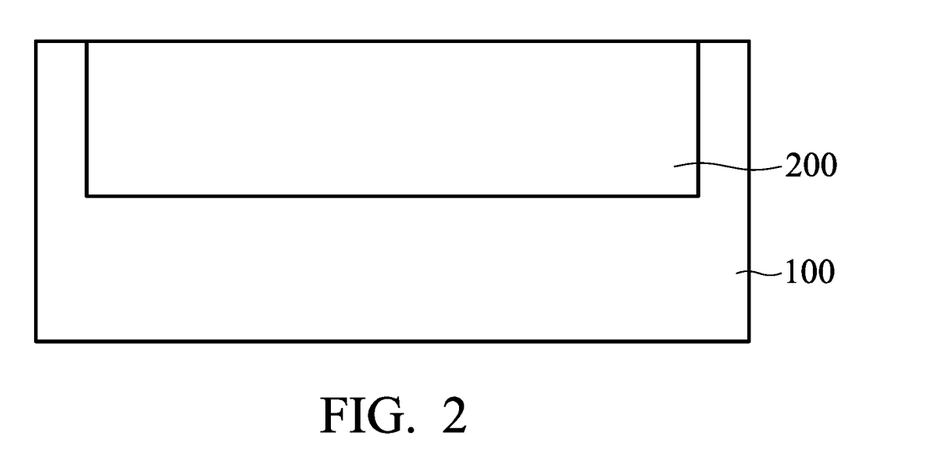

Then, as shown in FIG. 2, a well impurity is implanted into the semiconductor substrate 100 to form a well region 200. The well impurity of the well region 200 has a conductive type according to the conductive type of a semiconductor device which will subsequently be formed in the well region 200. In the embodiment illustrated, an N-type metal-oxide-semiconductor will subsequently be formed in the well region 200, and thus the well impurity of the well region 200 is a P-type impurity. For example, the P-type well region 200 can have a dopant concentration of 1E12 to 7E13 atoms/cm$^2$, and can be formed by implanting boron ions, indium ions, or boron difluoride ions (BF2$^+$) into a portion of the semiconductor substrate 100. For example, the well region 200 can have a depth of 0.03 to 0.75 um, but is it is not limited to this range.

Figure 3:
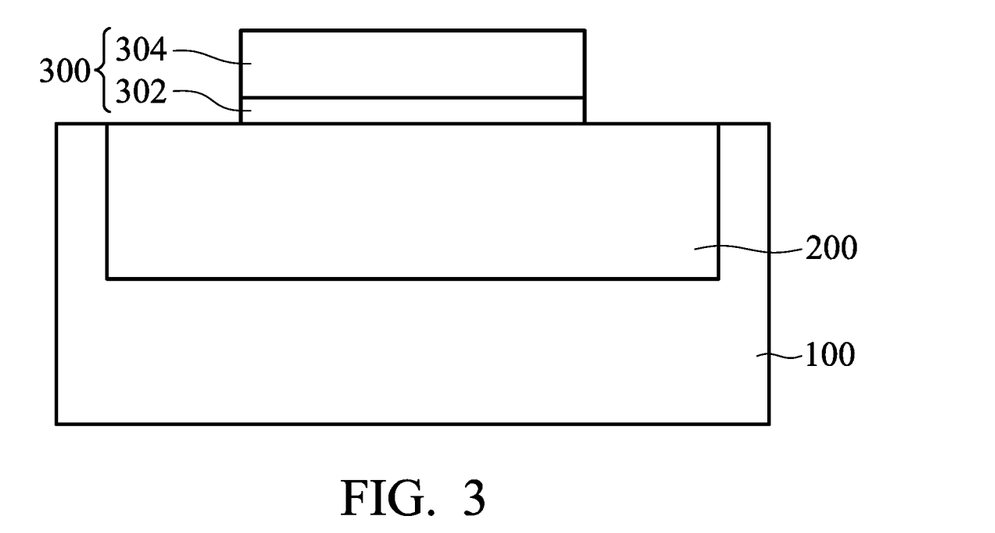

Then, as shown in FIG. 3, a gate structure 300 is formed on the well region 200. The gate structure 300 may include a gate dielectric layer 302, and a gate electrode 304 disposed on the gate dielectric layer 302. For example, the gate dielectric layer 302 may include silicon oxide or high k (dielectric constant) dielectric material. Examples of the high-k dielectric material include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), silicon nitride, silicon oxynitride, zirconium oxide, titanium oxide, aluminum oxide, hafnium dioxide-alumina (HfO$_2$—Al$_2$O$_3$) alloy, or other applicable dielectric materials. For example, the gate electrode 304 may include poly-silicon, aluminum, copper, tungsten, titanium, tantalum, titanium nitride, tantalum nitride, nickel silicide, cobalt silicide, TaC, TaSiN, TaCN, TiAl, TiAlN, or other applicable materials.

The process for forming the gate structure 300 may include a deposition process, a lithography process, and an etching process. The deposition process may include a chemical vapor deposition process (CVD), a physical vapor deposition process (PVD), an atomic layer deposition process (ALD), a high density plasma chemical vapor deposition process (HDPCVD), a metal organic chemical vapor deposition process (MOCVD), or a plasma enhanced chemical vapor deposition process (PECVD). The lithography process may include coating the photoresist (e.g., spin-on coating), soft bake, mask alignment, exposure, post-exposure baking, developing the photoresist, rinsing, drying (e.g., hard bake), and/or other applicable processes. The etching process may include a dry etching process, a wet etching process, and/or other etching process (e.g., a reactive ion etching process).

Figure 4:
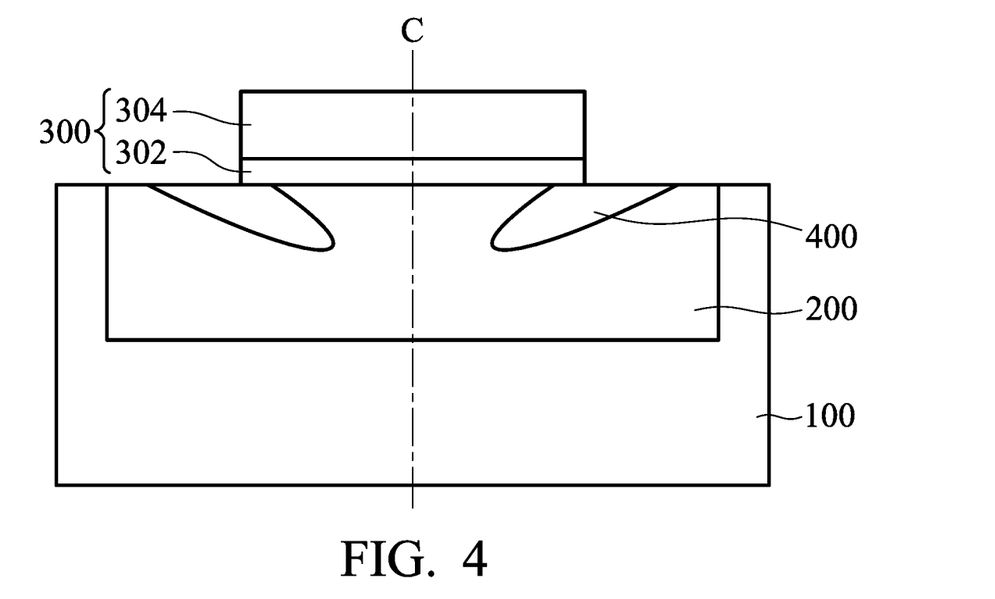

Then, as shown in FIG. 4, a halo implant region 400 is formed in the semiconductor substrate 100 around and below the gate structure 300. The halo implant region 400 includes an impurity having the same conductive type as the impurity of the well region 200. In the embodiment illustrated, the halo implant region 400 includes a P-type impurity. For example, the halo implant region 400 can have a dopant concentration of 1E13 to 4.5E13 atoms/cm$^2$, and can be formed by tilt implanting boron ions, indium ions, or boron difluoride ions (BF2$^+$) into the semiconductor substrate 100. In the tilt implantation process, the angle between the ion incident direction and the normal of the top surface of the semiconductor substrate may be 20 to 50 degrees. In some embodiments, the dopant concentration of the halo implant region 400 gradually decreases toward a center line C of the gate structure 300.

Figure 5:
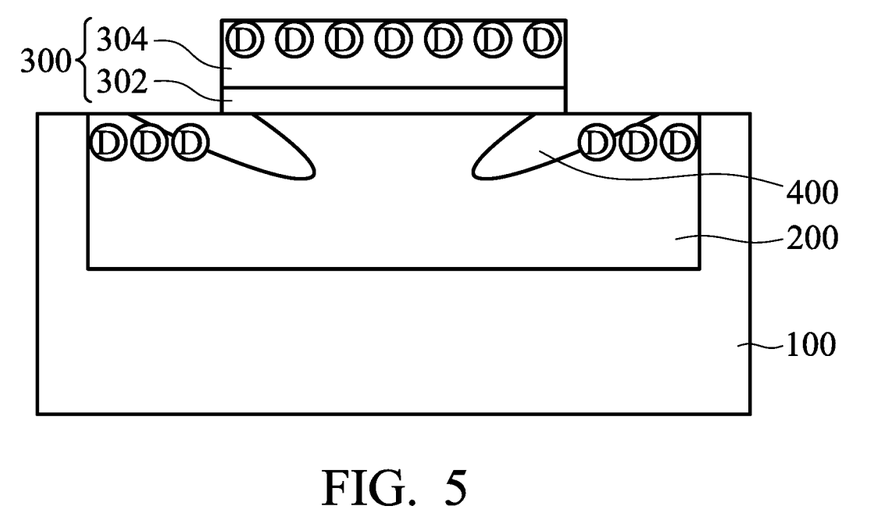

Then, as shown in FIG. 5, a first impurity D is implanted into the gate electrode 304 and the semiconductor substrate 100. For example, the first impurity D may include a nitrogen ion. In the embodiment illustrated, an implantation process may be used to implant the nitrogen ions into the gate electrode 304 and the semiconductor substrate 100. If the implant energy of the implantation process is too high, it will perturb the deeper portion of the well region and thus result in current leakage or reducing the isolation effect from an adjacent well region. If the implant energy of the implantation process is too low, it is disadvantageous to the device performance. For example, the implant energy of the implantation process may be 6 to 40 keV, and preferably 10 to 30 keV. If the implant dose of the implantation process is too high, it will drastically reduce the threshold voltage of the device, and thus increase the difference between the threshold voltage of a long channel device and a short channel device. If the implant dose of the implantation process is too low, the desired effect cannot be obtained. For example, the implant dose of the implantation process may be 1E14 to 1E16 atoms/cm$^2$, and preferably 5E14 to 6E15 atoms/cm$^2$.

Figure 6:
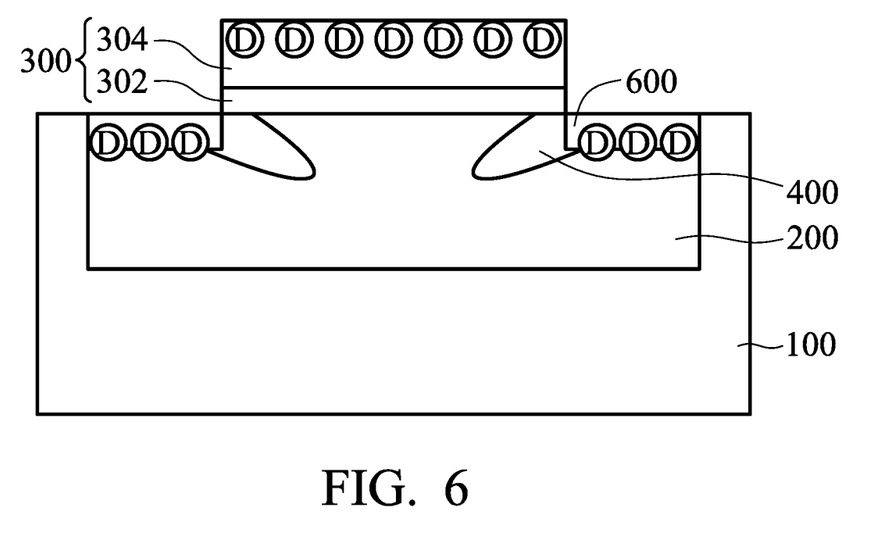

Then, as shown in FIG. 6, a lightly doped source/drain region 600 is formed in the semiconductor substrate 100 on opposite sides of the gate structure 300, and the lightly doped source/drain region 600 is adjacent to the halo implant region 400. The lightly doped source/drain region 600 includes an impurity with a conductive type opposite to the conductive type of the impurity of the well region 200. In the embodiment illustrated, lightly doped source/drain region 600 includes an N-type impurity. For example, the gate structure 300 can be used as a mask in an implantation process to implant phosphorous ions or arsenic ions into the semiconductor substrate 100 on opposite sides of the gate structure 300, such that an N-type lightly doped source/drain region 600 with a dopant concentration of 1E14 to 6E14 atoms/cm$^2$ is formed. It should be noted that although the implantation process to implant the nitrogen ions into the gate electrode 304 and the semiconductor substrate 100 is performed before the formation of the lightly doped source/drain region 600 in the embodiment illustrated, the implantation process to implant the nitrogen ions into the gate electrode 304 and the semiconductor substrate 100 can also be performed after the formation of the lightly doped source/drain region 600 in some other embodiments.

Figure 7A:
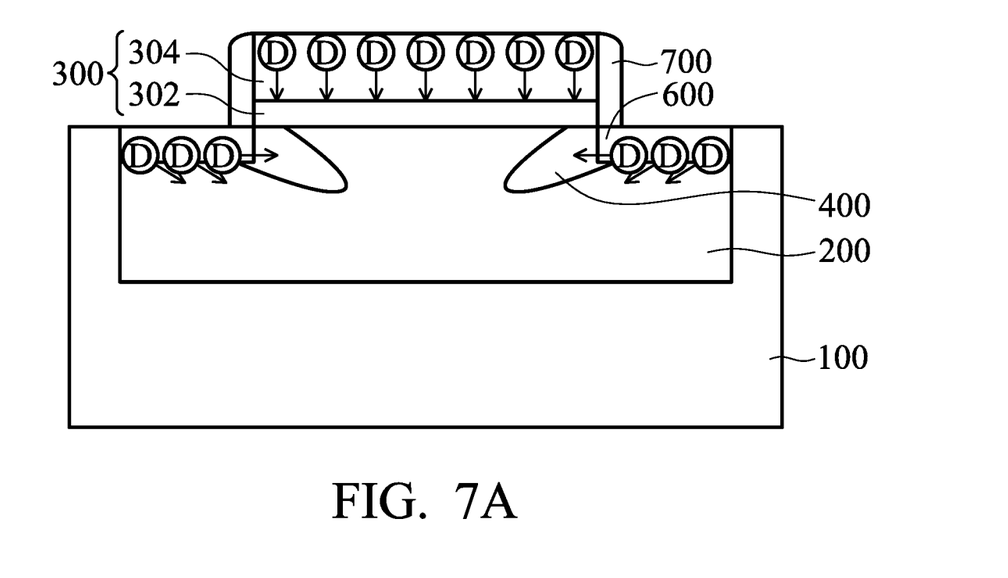

Then, as shown in FIG. 7A, a sidewall spacer 700 is formed on sidewalls of the gate structure 300. For example, the sidewall spacer 700 includes one or more layers of insulating materials (e.g., SiO$_2$, SiN, SiON, SiOCN or SiCN). The sidewall spacer 700 may be formed by a deposition process (e.g., a chemical vapor deposition process, a physical vapor deposition process, an atomic layer deposition process, an e-beam evaporation process, or other applicable deposition process) to deposit a spacer layer, and a subsequent anisotropic etch back process (e.g., a plasma etching process). In the embodiment illustrated, the deposition process to deposit the sidewall spacer layer is performed at a temperature of 625 to 750° C., and thus the nitrogen ions implanted into the semiconductor substrate 100 (as shown in FIG. 5) can be driven into a portion of the halo implant region 400 adjacent to the lightly doped source/drain region 600, such that a counter-doping region 702 (as shown in FIG. 7B) can be formed without an additional heat treatment process.

In the counter-doping region 702, the dopant concentration of the P-type impurity in the halo implant region is reduced appropriately by the nitrogen ions driven into the halo implant region. The dopant concentration of the counter-doping region 702 can be 15%-80% of the original dopant concentration of the halo implant region. In some embodiments, the dopant concentration of the counter-doping region 702 is 40%-80% of the original dopant concentration of the halo implant region, thus making it applicable for use in a semiconductor device with a normal threshold voltage (e.g., 0.37-0.45 volts). In other embodiments, the dopant concentration of the counter-doping region 702 is 15%-50% of the original dopant concentration of the halo implant region, thus making it applicable for use in a semiconductor device with a low threshold voltage (e.g., 0.21-0.285 volts). In some embodiments, the dopant concentration (P-type impurity) of the counter-doping region 702 is 15%-80% of the original dopant concentration of the halo implant region as a result of driving the nitrogen ions into the halo implant region, and thereby the reverse short channel effect is reduced. For example, the ratio of the dopant concentration of the counter-doping region 702 to the dopant concentration of the halo implant region 400 may be 3:20 to 16:20. In some embodiments, unlike the halo implant region 400, the dopant concentration of the counter-doping region 702 gradually increases toward the center line C of the gate structure 300.

Figure 7B:
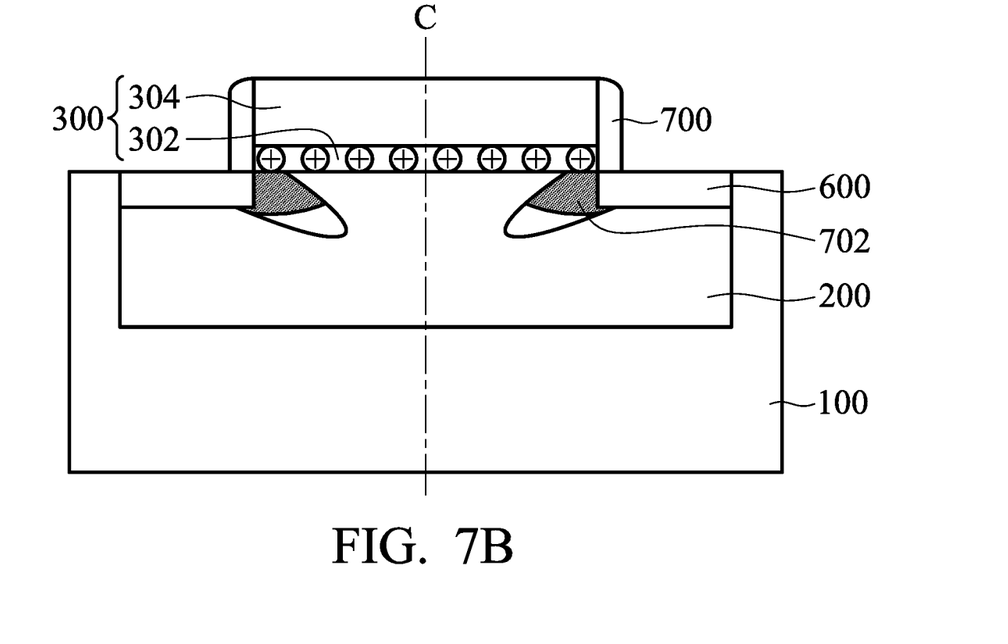

In addition, as shown in FIG. 7B, the temperature (or heat) of the process of forming the sidewall spacer in the embodiment illustrated can also drive the nitrogen ions implanted in the gate electrode 304 (as shown in FIG. 5) into the gate dielectric layer 302, thus forming positive charges in a lower portion of the gate dielectric layer 302. The positive charges can avoid or reduce the increase of the threshold voltage of a semiconductor device resulting from increasing the dopant concentration of the well region 200 (e.g., to reduce the leakage current between the source and drain region).

It should be noted that the counter-doping region 702 and the positive charges in the lower portion of the gate dielectric layer 302 are formed by the process 700 (i.e., by the temperature or heat thereof) used to form the sidewall spacer in the embodiment illustrated. However, in some other embodiments, an additional heat treatment process can be also performed to achieve the same results.

Figure 8:
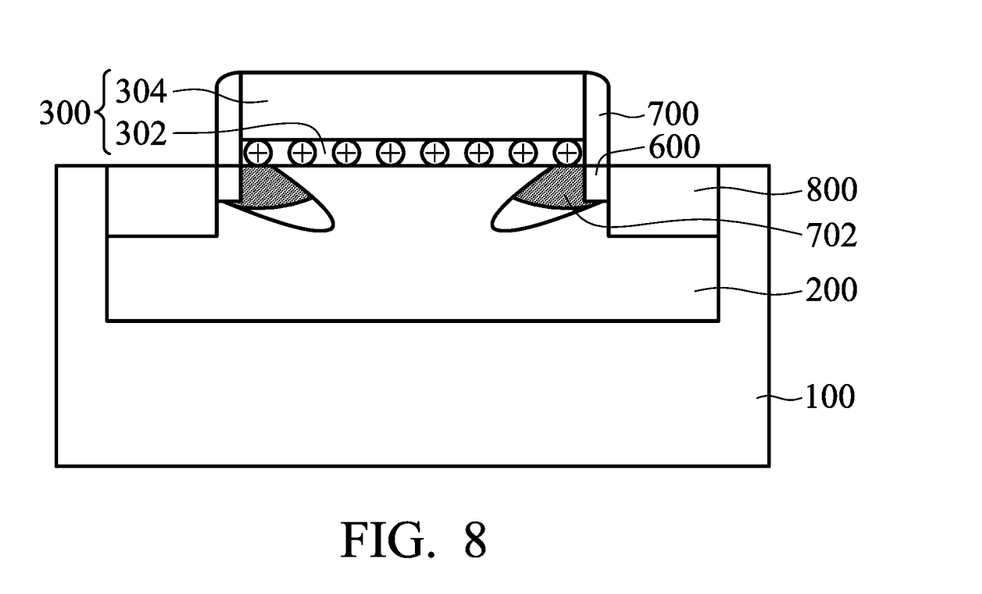

Then, as shown in FIG. 8, a source/drain region 800 is formed in the semiconductor substrate 100 on opposite sides of the sidewall spacer 700. In the embodiment illustrated, the source/drain region 800 includes an N-type impurity. For example, an N-type source/drain region 800 with a dopant concentration of 8E13 to 4.5E15 atoms/cm$^2$ can be formed by using the gate structure 300 and the sidewall spacer 700 as a mask to implant phosphorous ions or arsenic ions into the semiconductor substrate 100 on opposite sides of the sidewall spacer 700, and then activating the dopants with a heat treatment process. For example, the heat treatment process can be a rapid thermal process (RTP), the temperature of the heat treatment process can be 1000 to 1100° C., and the duration can be 1 to 20 seconds. The heat treatment process can also be a furnace annealing process, a laser spike annealing process (LSA), a laser thermal process (LTP), or another applicable heat treatment process. In some embodiments, the heat treatment process can also drive the implanted nitrogen ions in FIG. 5 into the halo implant region 400 and the gate dielectric layer 302.

In summary, the semiconductor device of the present disclosure includes a counter-doping region in the semiconductor substrate under the gate structure and between the lightly-doped source/drain region and the halo implant region. The counter-doping region has a dopant concentration that is lower than the dopant concentration of the halo implant region, such that the reverse short channel effect can be reduced. Additionally, the positive charges formed in the lower portion of the gate dielectric layer can avoid or reduce an increase of the threshold voltage of a semiconductor device resulting from increasing the dopant concentration of the well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection is better determined by the claims.

What is claimed is:
1. A semiconductor device, comprising:
a semiconductor substrate;
a gate structure disposed on the semiconductor substrate, wherein the gate structure comprises:
  a gate dielectric layer; and
  a gate electrode formed on the gate dielectric layer, wherein the gate dielectric layer comprises nitrogen ions so that a lower portion of the gate dielectric layer comprises positive charges;
a sidewall spacer disposed on sidewalls of the gate structure;
a lightly doped source/drain region formed in the semiconductor substrate on opposite sides of the gate structure;
a source/drain region formed in the semiconductor substrate on opposite sides of the sidewall spacer;
a halo implant region formed in the semiconductor substrate below the gate structure and adjacent to the lightly doped source/drain region, wherein the halo implant region is spaced apart from the source/drain region by a portion of the semiconductor substrate; and
a counter-doping region formed in the semiconductor substrate below the gate structure and between the lightly doped source/drain region and the halo implant region, the counter-doping region extending into the semiconductor substrate directly below the gate structure, wherein the entire counter-doping region is directly below the gate structure and the sidewall spacer, and wherein a dopant concentration of the counter-doping region is lower than a dopant concen- tration of the halo implant region, and the counter-doping region has a P-type impurity and a nitrogen ion.

2. The semiconductor device of claim 1, wherein the dopant concentration of the counter-doping region gradually increases toward a center line of the gate structure, and the dopant concentration of the halo implant region gradually decreases toward the center line of the gate structure.

3. The semiconductor device of claim 1, wherein the semiconductor device comprises an N-type metal-oxide-semiconductor (NMOS) device, the source/drain region is an N-type doping region, and the halo implant region and the counter-doping region are P-type doping regions.

4. The semiconductor device of claim 3, wherein the N-type metal-oxide-semiconductor device is formed in a P-type well region in the semiconductor substrate, and the halo implant region is spaced apart from the source/drain region by a portion of the P-type well region.

5. The semiconductor device of claim 4, wherein a dopant concentration of the P-type well region is 1E12 to 7E13 (atoms/cm$^2$).

6. The semiconductor device of claim 1, wherein the halo implant region has the P-type impurity, and a ratio of the dopant concentration of the counter-doping region to the dopant concentration of the halo implant region is 3:20 to 16:20.

7. A method for forming a semiconductor device as set forth in claim 1, comprising:
   providing a semiconductor substrate;
   forming a gate structure on the semiconductor substrate;
   forming a halo implant region in the semiconductor substrate around and below the gate structure;
   forming a lightly doped source/drain region in the semiconductor substrate on opposite sides of the gate structure, wherein the halo implant region is adjacent to the lightly doped source/drain region;
   forming a sidewall spacer on sidewalls of the gate structure;
   forming a source/drain region in the semiconductor substrate on opposite sides of the sidewall spacer; and
   forming a counter-doping region in the semiconductor substrate below the gate structure and between the lightly doped source/drain region and the halo implant region, wherein a dopant concentration of the counter-doping region is lower than a dopant concentration of the halo implant region.

8. The method for forming a semiconductor device of claim 7, wherein the dopant concentration of the counter-doping region gradually increases toward a center line of the gate structure.

9. The method for forming a semiconductor device of claim 7, wherein the semiconductor device comprises an N-type metal-oxide-semiconductor (NMOS) device, the source/drain region is an N-type doping region, and the halo implant region and the counter-doping region are P-type doping regions.

10. The method for forming a semiconductor device of claim 9, further comprising:
    implanting a P-type well impurity to form a P-type well region in the semiconductor substrate, wherein the N-type metal-oxide-semiconductor device is formed in the P-type well region.

11. The method for forming a semiconductor device of claim 9, wherein the gate structure comprises:
    a gate dielectric layer; and
    a gate electrode on the gate dielectric layer;
    wherein the step of forming the halo implant region comprises:
    implanting a P-type impurity with a tilt implantation process to form the halo implant region in the semiconductor substrate around and below the gate structure;
    wherein the step of forming the counter-doping region comprises:
    implanting a first impurity into the gate electrode and the semiconductor substrate; and
    performing a heat treatment process to drive the first impurity into a portion of the halo implant region adjacent to the lightly doped source/drain region to form the counter-doping region.

12. The method for forming a semiconductor device of claim 11, wherein the first impurity comprises a nitrogen ion.

13. The method for forming a semiconductor device of claim 11, wherein the step of forming the sidewall spacer comprises:
    depositing the sidewall spacer on the sidewalls of the gate structure at a temperature of 625 to 750° C., wherein the heat treatment process is performed by the heat of the step of depositing the sidewall spacer.

14. The method for forming a semiconductor device of claim 11, wherein the step of implanting the first impurity into the gate electrode and the semiconductor substrate is performed before the step of forming the lightly doped source/drain region in the semiconductor substrate.

15. The method for forming a semiconductor device of claim 11, wherein the step of implanting the first impurity into the gate electrode and the semiconductor substrate is performed after the step of forming the lightly doped source/drain region in the semiconductor substrate.

16. The method for forming a semiconductor device of claim 11, wherein the step of implanting the first impurity into the gate electrode and the semiconductor substrate is performed with an implant energy of 6 to 40 (keV) and with an implant dose of 1E14 to 1E16 (atoms/cm$^2$).

17. The method for forming a semiconductor device of claim 11, wherein a lower portion of the gate dielectric layer comprises positive charges.

18. The method for forming a semiconductor device of claim 17, wherein the positive charges of the lower portion of the gate dielectric layer are formed by the heat treatment process.

19. The semiconductor device of claim 1, wherein the counter-doping region is spaced apart from the source/drain region by the lightly doped source/drain region.

20. The semiconductor device of claim 1, wherein the dopant concentration of the counter-doping region is 15%-50% of the dopant concentration of the halo implant region such that the semiconductor device has a threshold voltage of 0.21-0.285 volts.

* * * * *